(12) United States Patent
Cheng et al.

(10) Patent No.: US 11,011,626 B2
(45) Date of Patent: May 18, 2021

(54) FIN FIELD-EFFECT TRANSISTOR WITH REDUCED PARASITIC CAPACITANCE AND REDUCED VARIABILITY

(71) Applicant: International Business Machines Corporation, Armonk, NY (US)

(72) Inventors: Kangguo Cheng, Schenectady, NY (US); Ruilong Xie, Niskayuna, NY (US); Juntao Li, Cohoes, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/405,200

(22) Filed: May 7, 2019

(65) Prior Publication Data

US 2020/0357896 A1     Nov. 12, 2020

(51) Int. Cl.
| | | |
|---|---|---|
| *H01L 29/66* | (2006.01) | |
| *H01L 29/78* | (2006.01) | |
| *H01L 21/033* | (2006.01) | |
| *H01L 21/8234* | (2006.01) | |
| *H01L 27/088* | (2006.01) | |

(52) U.S. Cl.
CPC ...... *H01L 29/6681* (2013.01); *H01L 21/0337* (2013.01); *H01L 21/823431* (2013.01); *H01L 21/823437* (2013.01); *H01L 21/823475* (2013.01); *H01L 27/0886* (2013.01); *H01L 29/66545* (2013.01); *H01L 29/785* (2013.01); *H01L 2029/7858* (2013.01)

(58) Field of Classification Search
CPC ......... H01L 21/0337; H01L 21/823431; H01L 21/823437; H01L 21/823475; H01L 27/0886; H01L 29/66545; H01L 29/6681; H01L 29/785
See application file for complete search history.

(56) References Cited

U.S. PATENT DOCUMENTS

| | | |
|---|---|---|
| 6,762,448 B1 | 7/2004 | Lin et al. |
| 7,659,157 B2 | 2/2010 | Greene et al. |
| 8,826,213 B1 | 9/2014 | Ho et al. |
| 8,889,494 B2 | 11/2014 | Toh et al. |
| 9,040,363 B2 | 5/2015 | Basker et al. |
| 9,257,536 B2 | 2/2016 | Adam et al. |
| 9,362,309 B2 | 6/2016 | Adam et al. |

(Continued)

FOREIGN PATENT DOCUMENTS

EP      3264473 A1     1/2018

OTHER PUBLICATIONS

T. Yamashita et al., "A Novel ALD SiBCN Low-k Spacer for Parasitic Capacitance Reduction in FinFETs," Symposium on VLSI Technology Digest of Technical Papers, 2015, 2 pages.

*Primary Examiner* — Allan R Wilson
(74) *Attorney, Agent, or Firm* — Douglas Pearson; Ryan, Mason & Lewis, LLP

(57) ABSTRACT

A method for manufacturing a semiconductor device includes patterning a plurality of semiconductor fins on a semiconductor substrate, and replacing at least two of the plurality of semiconductor fins with a plurality of dummy fins including a dielectric material. A gate structure is formed on and around the plurality of semiconductor fins and the plurality of dummy fins, and a source/drain contact is formed adjacent the gate structure.

20 Claims, 11 Drawing Sheets

(56) References Cited

U.S. PATENT DOCUMENTS

| | | | |
|---|---|---|---|
| 9,397,099 B1* | 7/2016 | Huang | H01L 21/823431 |
| 9,685,501 B2 | 6/2017 | Leobandung | |
| 9,865,735 B2 | 1/2018 | Sun et al. | |
| 10,014,297 B1* | 7/2018 | Sun | H01L 27/0886 |
| 2013/0270655 A1 | 10/2013 | Adam et al. | |
| 2014/0264600 A1 | 9/2014 | Adam et al. | |
| 2015/0243755 A1 | 8/2015 | Cheng et al. | |
| 2018/0040713 A1* | 2/2018 | Chang | H01L 27/0886 |
| 2018/0096999 A1* | 4/2018 | Zhou | H01L 29/1037 |
| 2018/0315864 A1 | 11/2018 | Li et al. | |
| 2020/0020782 A1* | 1/2020 | Ching | H01L 21/3086 |

* cited by examiner

FIN FIELD-EFFECT TRANSISTOR WITH REDUCED PARASITIC CAPACITANCE AND REDUCED VARIABILITY

BACKGROUND

Given increased density and large-scale integration requiring more efficient use of area on a chip, device sizes are continuing to decrease. For example, devices are progressing toward the 5 nm node and beyond. Shrinking transistor sizes have led to aggressive scaling of pitches, such that device characteristics and performance are influenced by physical layout. For example, as transistor gate pitch decreases, performance issues caused by parasitic capacitance have developed. In order to improve performance, a number of techniques have been employed to reduce capacitance, such as, the use of airgap spacers, low-k dielectrics, and low-k diffusion breaks.

Additional issues with performance are caused by transistor variability due to, for example, low fin cut lithography margins, fin etching loading issues, and gate planarization problems with tall fins.

There is a need, therefore, for improved transistor layout in an integration scheme which enables chip area scaling while maintaining functionality.

SUMMARY

According to an exemplary embodiment of the present invention, a method for manufacturing a semiconductor device includes patterning a plurality of semiconductor fins on a semiconductor substrate, and replacing at least two of the plurality of semiconductor fins with a plurality of dummy fins including a dielectric material. A gate structure is formed on and around the plurality of semiconductor fins and the plurality of dummy fins, and a source/drain contact is formed adjacent the gate structure.

According to an exemplary embodiment of the present invention, a semiconductor device includes a plurality of semiconductor fins disposed on a semiconductor substrate, and a plurality of dummy fins including a dielectric material disposed on the semiconductor substrate. A gate structure is disposed on and around the plurality of semiconductor fins and the plurality of dummy fins, and a source/drain contact is disposed adjacent the gate structure.

According to an exemplary embodiment of the present invention, a method for manufacturing a semiconductor device includes forming a plurality of first hardmask portions and a plurality of second hardmask portions on a semiconductor substrate. The plurality of first hardmask portions include a first material and the plurality of second hardmask portions include a second material different from the first material. A pattern of the plurality of first and second hardmask portions is transferred to the semiconductor substrate to form a plurality of patterned substrate portions, and a dielectric fill layer is formed on the semiconductor substrate and between the plurality of patterned substrate portions. The method also includes selectively removing the plurality of second hardmask portions to expose underlying patterned substrate portions of the plurality of patterned substrate portions, and removing the exposed underlying patterned substrate portions to create a plurality of openings in the dielectric fill layer. A dielectric material is deposited in the plurality of openings in place of the removed patterned substrate portions to form a plurality of dummy elements.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
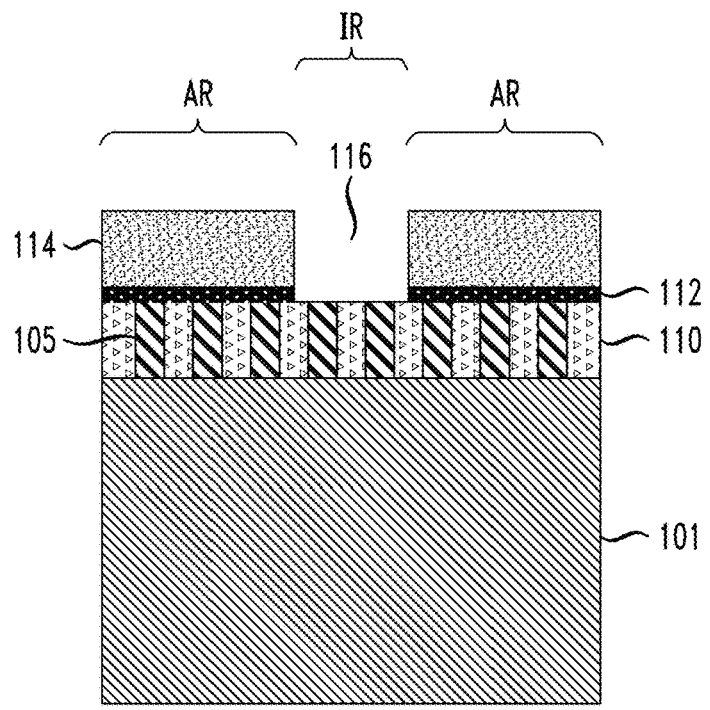
FIG. 1 is a cross-sectional view illustrating formation of a hardmask pattern and masking of a portion of the hardmask pattern in an active region in a method of manufacturing a semiconductor device, according to an exemplary embodiment of the present invention.

Exemplary embodiments of the invention will now be discussed in further detail with regard to semiconductor devices and methods of manufacturing same and, in particular, to the formation of dummy fins to reduce parasitic capacitance between shared gates and shared source/drain contacts.

It is to be understood that the various layers and/or regions shown in the accompanying drawings are not drawn to scale, and that one or more layers and/or regions of a type commonly used in, for example, field-effect transistor (FET), fin field-effect transistor (FinFET), metal-oxide-semiconductor field-effect transistor (MOSFET), nanowire FET, vertical FET, single electron transistor (SET), complementary metal-oxide semiconductor (CMOS) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, nanowire FETs, nanosheet FETs, vertical FETs, SETs, CMOSs and/or MOSFETs. By way of non-limiting example, the semiconductor devices can include, but are not necessarily limited to FET, FinFET, nanowire FET, nanosheet FET, vertical FET, SET, CMOS and MOSFET devices, and/or semiconductor devices that use FET, FinFET, nanowire FET, nanosheet FET, vertical FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In a dense transistor array, parasitic capacitance can be significant. Large overlapping areas of gates and source/drain contacts in isolation regions (e.g., shallow trench isolation (STI) regions) cause significant parasitic capacitance between gate regions and source/drain contacts due to thin spacers between gate and contact metals. Instead of semiconductor fins, one or more embodiments include dummy dielectric fins formed of, for example, silicon carbide (SiC), in an isolation region, resulting in reduced parasitic capacitance between shared source/drain contacts and shared gates of two or more transistors. The dummy dielectric fins reduce overlapping area between metal gates and source/drain contacts in an isolation region.

Referring to FIG. 1, a hardmask pattern including a plurality of patterned hardmask portions 105 spaced apart from each other is formed on a substrate 101. The hardmask portions 105 include, for example, a nitride material, such as, but not necessarily limited to, silicon nitride (SiN). According to an embodiment, a hardmask layer is deposited on the substrate 101 using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. In some embodiments, a planarization process, such as, chemical mechanical planarization (CMP) can be used to remove excess hardmask layer material. A height of the hardmask layer can be in the range of, but is not necessarily limited to, 20 nm to 100 nm.

The hardmask layer is patterned into the plurality of patterned hardmask portions 105. Spacers (not shown) can be used as masks for patterning the hardmask layer. The spacers are formed to be spaced apart from each other on the hardmask layer. In order to form the spacers, a plurality of mandrels comprising, but not necessarily limited to, amorphous silicon (a-Si), amorphous carbon, polycrystalline silicon, polycrystalline silicon germanium, amorphous silicon germanium, polycrystalline germanium, and/or amorphous germanium, are patterned on hardmask layer. The mandrel patterning can be done by various patterning techniques, including, but not necessarily limited to, lithography patterning followed by directional etching and/or a sidewall image transfer (SIT) process, for example. In some embodiments, the process includes using lithography followed by directional etching (e.g., reactive ion etch (ME)) to form a mandrel. After the mandrel formation, a conformal film can be deposited and then followed by an etchback process (e.g., ME). The conformal film will form spacers at both sides of each mandrel. The spacer material can include, but is not limited, an oxide, such as silicon oxide (e.g., $SiO_2$ or $SiO_x$), formed by low-pressure chemical vapor deposition (LPCVD), PECVD, sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, or limited reaction processing CVD (LRPCVD). Alternatively, some other dielectric materials, such as, for example, silicon oxycarbonitride (SiOCN), silicon carbonitride (SiCN) or siliconoxycarbide (SiOC), can be used as the material of the spacers.

Exposed portions of the hardmask layer not under the spacers (e.g., not masked by the spacers) are removed using, for example, a directional etching process, comprising RIE composed of $CH_2F_2$ or other chemistry as is known to etch silicon nitride selective to other materials. The patterning of the hardmask layer into the plurality of patterned hardmask portions 105 spaced apart from each other can be performed using, for example, SAMP techniques, including, but not necessarily limited to self-aligned double patterning (SADP), self-aligned quadruple patterning (SAQP) and self-aligned octuple patterning (SAOP). Non-limiting ranges in connection with the hardmask portions 105 include, for vertical height, about 50 nm to about 100 nm, for lateral width, about 8 nm to about 20 nm, and for pitch (lateral distance between centers of adjacent hardmask portions), about 30 nm to about 80 nm.

The substrate 101 includes a semiconductor material including, but not necessarily limited to, silicon (Si), silicon germanium (SiGe), Si:C (carbon doped silicon), carbon doped silicon germanium (SiGe:C), II-V compound semiconductor or other like semiconductor. In addition, multiple layers of the semiconductor materials can be used as the semiconductor material of the substrate. In some embodiments, the substrate 101 includes other device structures such as transistors, contacts, conducting wires, etc.

FIG. 1 further illustrates masking of a portion of the hardmask pattern in active transistor regions AR. A mask (also referred to herein as a "lithography stack") includes, for example, an optical planarization layer (OPL) 110, formed on the substrate 101 and on and around the hardmask portions 105. As can be seen, a top surface of the OPL 110 is substantially planar or planar with top surfaces of the hardmask portions 105. The mask further includes an anti-reflective layer 112 formed on portions of the OPL 110 and a photoresist 114 formed on the anti-reflective layer 112.

The mask includes an opening 116 where the photoresist 114 and anti-reflective layer 112 are absent, leaving exposed top surfaces of one or more of the patterned hardmask portions 105 in an isolation region IR, while covering the hardmask portions 105 in active regions AR. In the embodiment shown in FIG. 1, top surfaces of two of the hardmask portions 105 are exposed, but the embodiments are not necessarily limited thereto. For example, depending on design, more than two hardmask portions 105, or less than two hardmask portions 105 may be exposed for forming more than or less than two dummy fins in an isolation region. In addition to FIG. 1, FIGS. 9A and 11A described in more detail herein below illustrate isolation region IR and active regions AR.

Figure 2:
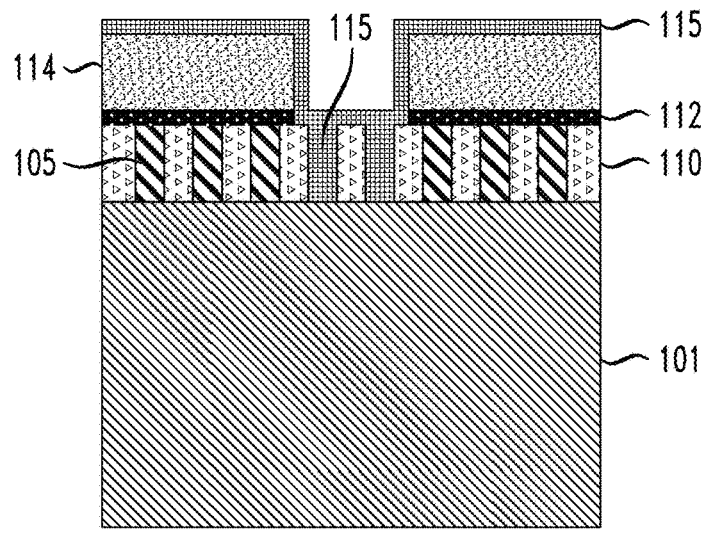
FIG. 2 is a cross-sectional view illustrating removal of an exposed portion of a hardmask pattern in an isolation region and replacement of the removed portion with a dielectric material in a method of manufacturing a semiconductor device, according to an exemplary embodiment of the present invention.

Referring to FIG. 2, the exposed hardmask portions 105 of the hardmask pattern are removed and replaced with a dielectric material. The hardmask portions 105 are removed using an etching process such as, for example, an aqueous solution containing phosphoric acid to remove silicon nitride. Alternatively silicon nitride can be removed by chemical dry etching. Following removal of the exposed hardmask portions 105, a dielectric layer 115 different from the material of the hardmask portions 105, such as, for example, low temperature SiC, SiOC or other material which can be selectively etched with respect to the material of the hardmask portions 105, is deposited on exposed surfaces of the photoresist 114, anti-reflective layer 112 and OPL 110, including in vacancies in the OPL 110 left by the removal of the exposed hardmask portions 105. Low temperature signifies that the deposited dielectric layer 115 is deposited at a temperature that is compatible with the photoresist, for example, below about 300° C. The portions of the dielectric layer 115 filling the vacancies in the OPL 110 form additional hardmask portions 115 having the different material from the hardmask portions 105. Deposition of the dielectric layer/additional hardmask portions 115 is performed using, for example, a conformal deposition technique, such as, for example, ALD.

Figure 3:
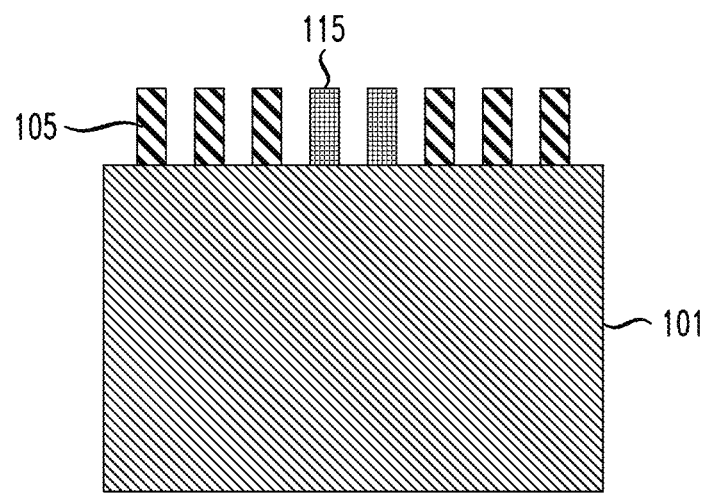
FIG. 3 is a cross-sectional view illustrating removal of a lithography stack and a hardmask pattern on a substrate with different hardmask materials in active and isolation regions in a method of manufacturing a semiconductor device, according to an exemplary embodiment of the present invention.

Referring to FIG. 3, portions of the dielectric layer 115 not forming the additional hardmask portions are removed in an isotropic etch back process using, for example, a dry etch process containing $NF_3$, $CHF_3$, $C_4F_8$, HBr and $O_2$ to etch silicon carbide (SiC). Then, the lithography stack including the OPL 110, anti-reflective layer 112 and the photoresist 114 are removed in an ashing process. Following removal of the lithography stack, a hardmask pattern on the substrate 101 includes hardmask portions 105 and 115 with different hardmask materials, respectively, in active and isolation regions AR and IR.

Figure 4:
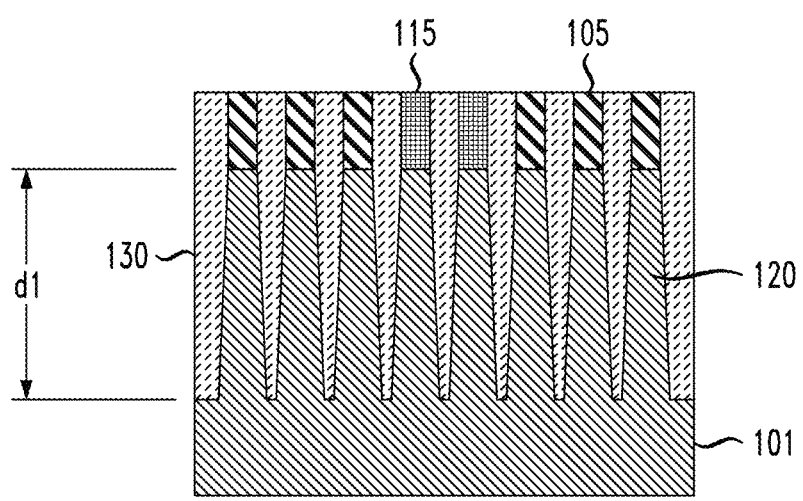
FIG. 4 is a cross-sectional view illustrating fin patterning and dielectric fill layer deposition in a method of manufacturing a semiconductor device, according to an exemplary embodiment of the present invention.

Referring to FIGS. 3 and 4, using the patterned hardmask portions 105 and 115 as masks, exposed portions of the substrate 101 not covered by the hardmask portions 105 and 115 are removed to certain depth d1 (depending on design) using a substrate etch. The substrate etch transfers the pattern of the remaining hardmask portions 105, 115 to the substrate to form patterned substrate portions 120. In accordance with an embodiment of the present invention, substrate 101 including a semiconductor material, such as, Si, SiGe, Si:C, SiGe:C, II-V compound semiconductor or other like semiconductor, can be selectively etched with respect to the hardmask portions 105, 115 using, for example, a silicon RIE process, In the embodiment described in connection with FIG. 4, the processing can form patterned substrate portions 120 in a tight pitch structure. The patterned substrate portions 120 can form, for example, semiconductor fins or other semiconductor structures at a close pitch with respect to each other and having relatively small critical dimensions (e.g., width). For example, the pitch can be in the range of about 30 nm to about 40 nm, but is not limited thereto, and the critical dimension of the substrate portions 120 can be in the range of about 8 nm to about 10 nm, but is not limited thereto. The patterned substrate portions 120 may be referred to herein as semiconductor fins. However, the embodiments are not necessarily limited thereto. For example, the patterned substrate portions may also be semiconductor nanowires.

Following formation of the patterned substrate portions 120 (e.g., semiconductor fins), a dielectric fill layer 130 is formed on the substrate 101 and around the patterned substrate portions 120 including the hardmask portions 105 and 115 thereon. The dielectric fill layer 130 includes, but is not necessarily limited to, an oxide, such as, for example, silicon oxide, carbon-doped silicon oxide (SiCO) or some other oxide. Dielectric fill layer 130 can be deposited using a deposition technique, including, but not necessarily limited to, CVD, PECVD, PVD, ALD, MBD, PLD, and/or liquid LSMCD followed by a planarization process, such as, for example, chemical mechanical polishing (CMP). The planarization process removes excess portions of the dielectric fill layer 130 above the hardmask portions 105 and 115 to form an uppermost surface of the dielectric fill layer 130 that is substantially planar or planar with the uppermost surfaces of the hardmask portions 105 and 115.

Figure 5:
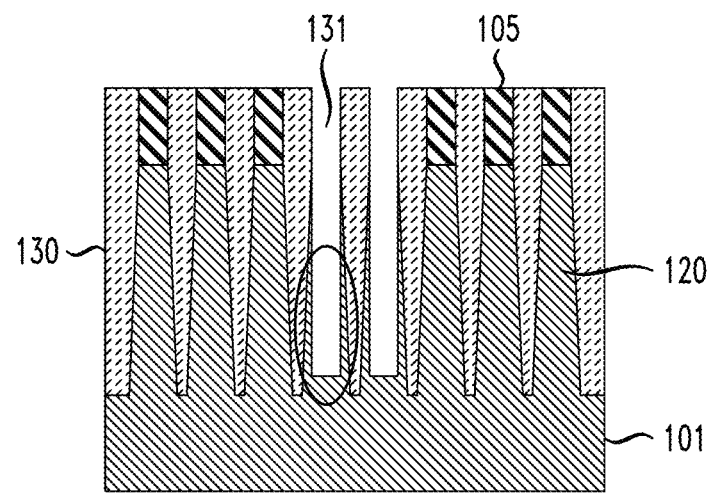
FIG. 5 is a cross-sectional view illustrating selective removal of hardmasks to expose fins and etching of the exposed fins from the isolation region in a method of manufacturing a semiconductor device, according to an exemplary embodiment of the present invention.

Referring to FIG. 5, the hardmask portions 115 are selectively removed with respect to the hardmask portions 105 and the dielectric fill layer 130 to expose patterned substrate portions 120 (e.g., semiconductor fins) in the isolation region IR. The selective removal of the hardmask portions 115 is performed using, for example, a dry etch process containing $NF_3$, $CHF_3$, $C_4F_5$, HBr and $O_2$.

Following the selective removal of the hardmask portions 115, the underlying exposed patterned substrate portions 120 are removed in an anisotropic RIE process using, for example, a plasma etch with fluorine-containing gas or plasma (fluorides (e.g., xenon difluoride ($XeF_2$)), or with an interhalogen ($BrF_3$ or $ClF_3$)), sulfur hexafluoride ($SF_6$), hydrogen chloride (HCl), or any combination thereof to create openings 131 in the dielectric fill layer 130 in areas previously occupied by the substrate portions 120. As can be seen by the circled portion in FIG. 5, some residual portions of the patterned substrate portions 120 may remain in the openings 131 after the anisotropic RIE process.

Figure 6:
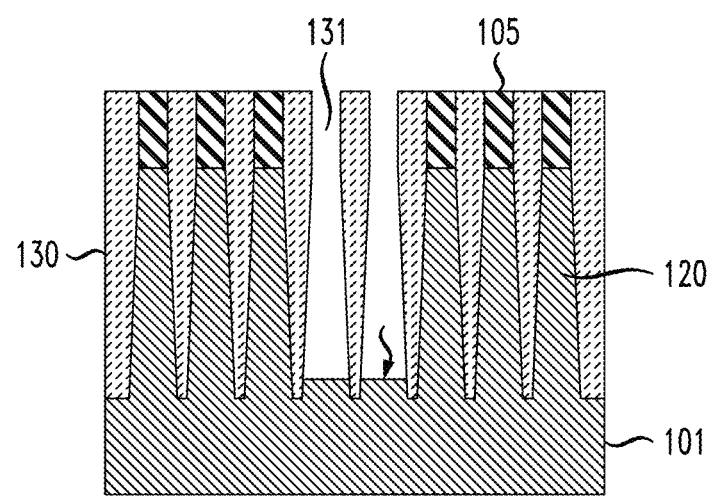
FIG. 6 is a cross-sectional view illustrating removal of residual portions of the etched fins in a method of manufacturing a semiconductor device, according to an exemplary embodiment of the present invention.

Referring to FIG. 6, an isotropic etch using, for example, a wet etch wet etch process containing ammonium hydroxide ($NH_4OH$), tetramethylammonium hydroxide (TMAH), hydrazine, ethylene diamine pyrocatechol (EDP), and/or HF/Nitric/Acetic Acid (HNA), is performed to remove the residual portions noted in FIG. 5 from the openings 131. As noted by the arrow in FIG. 6, depending on the timing of the etch process, some of the residual portion at a bottom of one or more of the openings 131 may remain such that a top surface of the remaining semiconductor material in the one or more openings 131 is higher than top surfaces of the substrate 101 under the dielectric fill layer 130. Alternatively, the entire residual portions in the openings 131 are removed such that the top surfaces of the remaining semiconductor material in the openings 131 are planar or substantially planar with the top surfaces of the substrate 101 under the dielectric fill layer 130.

Figure 7:
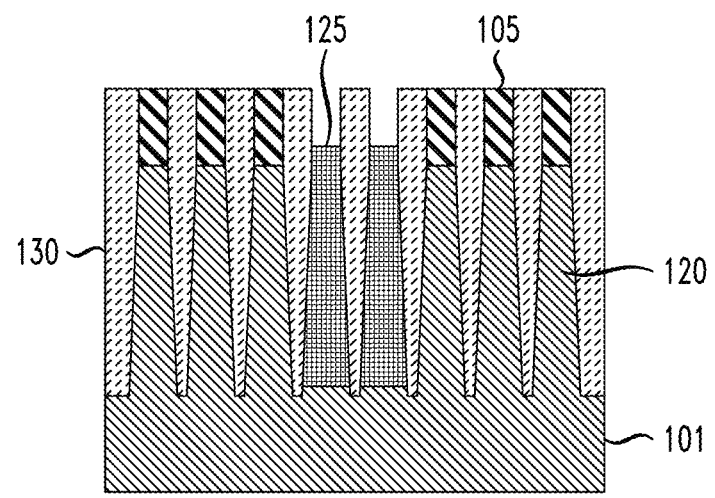
FIG. 7 is a cross-sectional view illustrating dielectric deposition and recessing to form dummy fins in a method of manufacturing a semiconductor device, according to an exemplary embodiment of the present invention.

Referring to FIG. 7, following removal of the residual portions from the openings 131 a dielectric material, such as, for example, SiC or SiOC, is deposited in the openings 131 and recessed to form dummy elements 125 (e.g., dummy fins) in the isolation region IR. The deposition of the dielectric material to form the dummy elements 125 is performed using a deposition technique, including, but not necessarily limited to, CVD, PECVD, PVD, ALD, MBD, PLD, and/or liquid LSMCD. The recessing is performed using, for example, a dry etch process containing $NF_3$, $CHF_3$, $C_4F_8$, HBr and $O_2$. According to an embodiment, there may be some airgaps at a bottom of the dummy elements 125 if the dielectric does not perfectly fill in the openings 131. The dummy elements 125 may be referred to herein as dummy fins or dielectric fins. However, the embodiments are not necessarily limited thereto. For example, the dummy elements may also be dummy nanowires.

The dummy elements 125 are recessed to a height which is above the height of the patterned substrate portions 120 (e.g., semiconductor fins). The taller dummy elements 125 enable more overlap reduction (resulting in less parasitic capacitance) between resulting metal gates and source/drain contacts in the isolation region than shorter dummy elements 125. According to an embodiment, the height of the dummy elements 125 with respect to the substrate 101 is greater than the height of the patterned substrate portions 120, but is less than a height of the resulting gates (e.g., gate structures 170 described herein).

Figure 8:
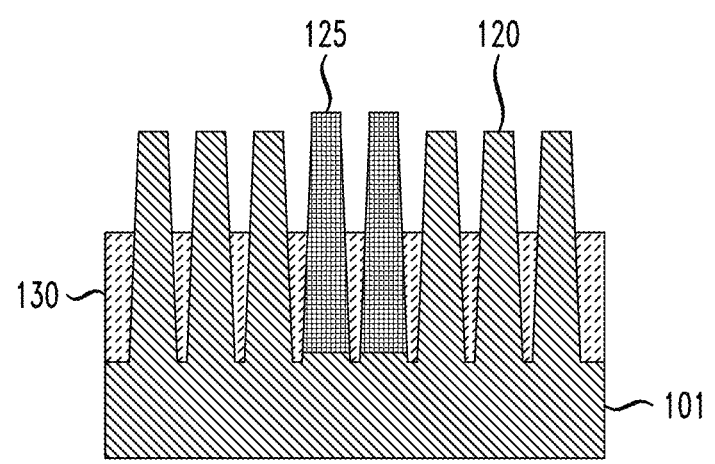
FIG. 8 is a cross-sectional view illustrating recessing of a dielectric fill layer formed around a plurality of fins in a method of manufacturing a semiconductor device, according to an exemplary embodiment of the present invention.

Referring to FIG. 8, the dielectric fill layer 130 is recessed to reveal upper portions (e.g., channel regions) of the patterned substrate portions 120 and the dummy elements 125 (e.g., semiconductor and dummy fins 120 and 125). In addition, the remaining hardmask portions 105 are removed from the top surfaces of the patterned substrate portions 120. The dielectric fill layer 130 is recessed to a height in order to expose about half of each of the patterned substrate portions 120 and the dummy elements 125. However, the embodiments are not necessarily limited thereto, and the dielectric fill layer can be recessed to lower or greater vertical heights. The recessing of the dielectric fill layer 130 is performed using, for example, a wet etch process containing hydrogen fluoric acid, a dry etch process such as chemical oxide removal, or a combination of both processes. The remaining hardmask portions 105 are removed from the top surfaces of the patterned substrate portions 120 using, for example, a wet etch process containing phosphoric acid. As can be seen in FIG. 8, a vertical height of the dummy elements 125 in an isolation region IR is greater than a vertical height of the patterned substrate portions 120 in active regions AR.

Figure 9A:
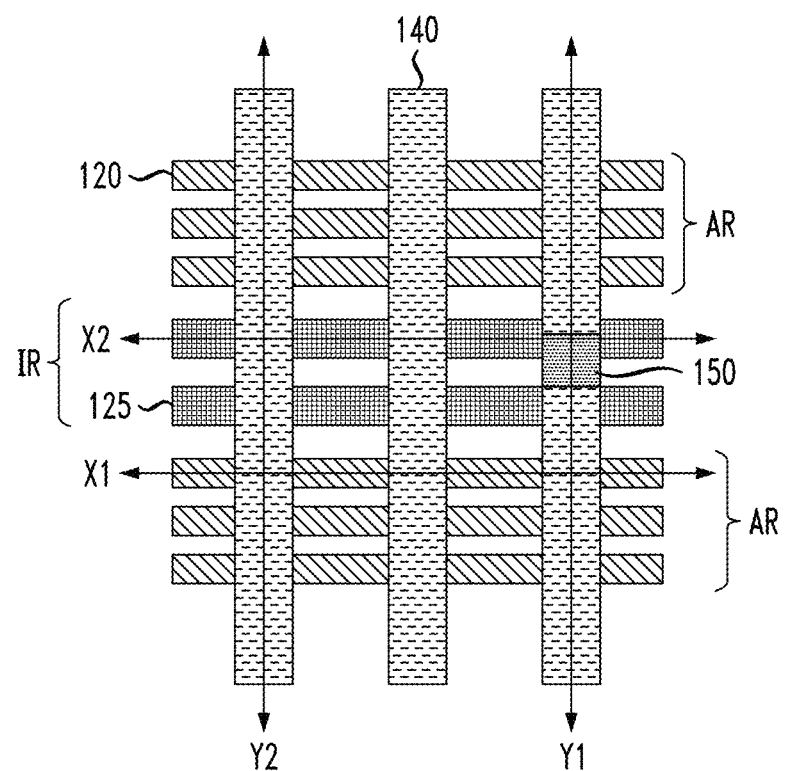
FIG. 9A is a top view illustrating a plurality of fins in an active region, a plurality dummy fins in an isolation region and a plurality of dummy gates formed around the fins the active and isolation regions in a method of manufacturing a semiconductor device, according to an exemplary embodiment of the present invention.

The top view in FIG. 9A illustrates the plurality of patterned substrate portions 120 (e.g., semiconductor fins) in an active region AR, the plurality dummy elements 125 (e.g., dummy fins) in an isolation region IR and a plurality of dummy gates 140 formed around the fins 120 and 125. The dummy gates 140 include, but are not necessarily limited to, amorphous silicon (a-Si), polycrystalline silicon, amorphous silicon germanium (a-SiGe), amorphous carbon (a-C) or other dummy gate material that may be used in connection with replacement metal gate (RMG) processing. The dummy gate may further comprise a dummy gate dielectric (e.g., silicon oxide) between the fins and other dummy gates. Referring to FIG. 9C, which is a cross-sectional view taken along the line Y2 in FIG. 9A, a dummy gate 140 is formed on the dielectric fill layer 130, and on and around the semiconductor and dummy fins 120 and 125. The dummy gates 140 can be formed using a deposition technique, such as, for example, CVD, PECVD, PVD, ALD, MBD, PLD, and/or liquid LSMCD, which may be followed by a planarization step, such as CMP.

Figure 9B:
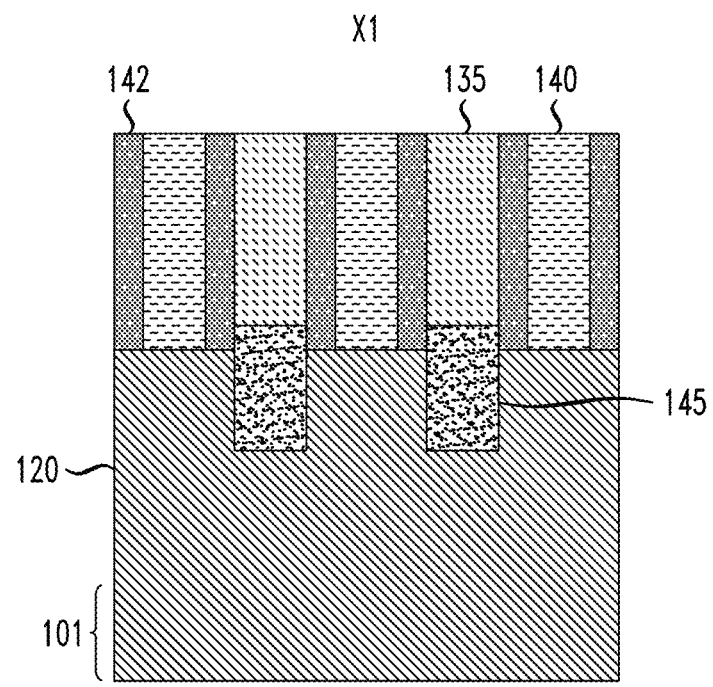
FIG. 9B is a cross-sectional view taken along the line X1 in FIG. 9A and illustrating dummy gate, spacer, source/drain region and inter-layer dielectric (ILD) layer formation in a method of manufacturing a semiconductor device, according to an exemplary embodiment of the present invention.
Figure 9C:
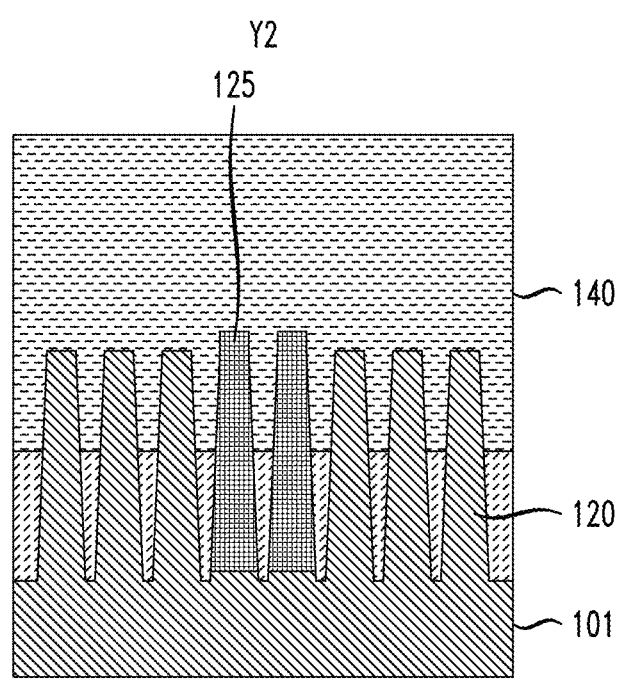
FIG. 9C is a cross-sectional view taken along the line Y2 in FIG. 9A and illustrating dummy gate formation in a method of manufacturing a semiconductor device, according to an exemplary embodiment of the present invention.

FIG. 9B is cross-sectional view taken along the line X1 in FIG. 9A (along the length of semiconductor fin 120) and illustrates dummy gates 140, spacers 142, source/drain region 145 and inter-layer dielectric (ILD) layers 135 formed on a fin 120. The dummy gates 140 include spacer layers 142 formed around the dummy gates 140. The spacer layers 142 include, but are not necessarily limited to, silicon boron nitride (SiBN), siliconborocarbonitride (SiBCN), silicon oxycarbonitride (SiOCN), SiN or $SiO_x$.

Source/drain regions 145 are formed adjacent the dummy gates 140 including the spacers 142 thereon. In accordance with an embodiment, the source/drain regions 145 are epitaxially grown to the sides of the dummy gates 140 and may be, for example, n-type or p-type doped. The source/drain regions 145 are formed by, for example, dopant implantation or in-situ doping during epitaxial growth of the source/drain regions. Dopants may include, for example, an n-type dopant such as, for example, phosphorous (P) or arsenic (As), and a p-type dopant such as, for example, boron (B) at various concentrations. For example, in a non-limiting example, a dopant concentration range may be $1 \times 10^{19}/cm^3$ to $3 \times 10^{21}/cm^3$.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

ILD layers 135 are deposited on the source/drain regions 135 in between the spacers 142, and on exposed portions of dielectric fill layer 130, the patterned substrate portions 120 and the dummy elements 125. The ILD layers 135 includes the same or similar materials as the dielectric fill layer 130, can be deposited using, for example, deposition techniques including, but not limited to, CVD, PECVD, PVD, ALD, MBD, PLD, and/or liquid LSMCD. Following deposition of the ILD layers 135, excess portions of the ILD layers 135 are removed by a planarization process, such as, for example, CMP, which planarizes the ILD layers 135 with the dummy gates and spacers 140 and 142.

Figure 9D:
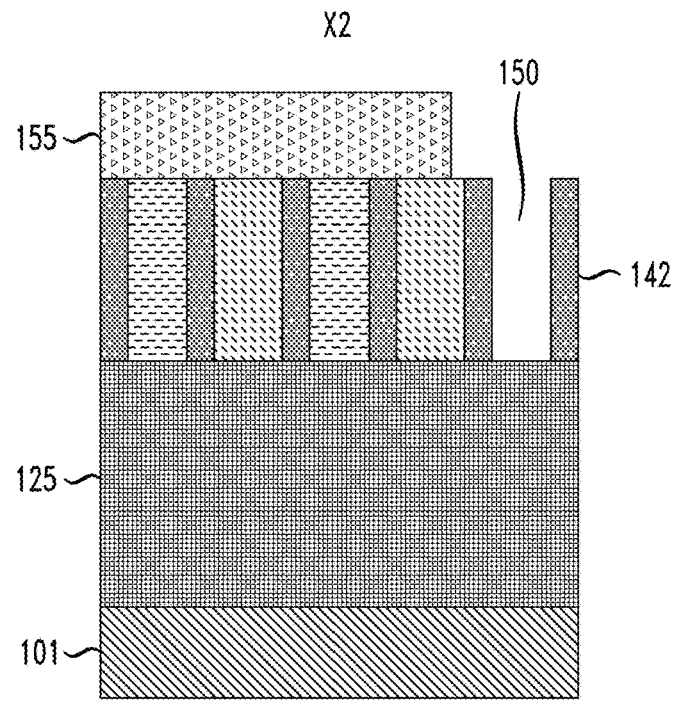
FIG. 9D is a cross-sectional view taken along the line X2 in FIG. 9A and illustrating removal of a portion of a dummy gate in a method of manufacturing a semiconductor device, according to an exemplary embodiment of the present invention.
Figure 9E:
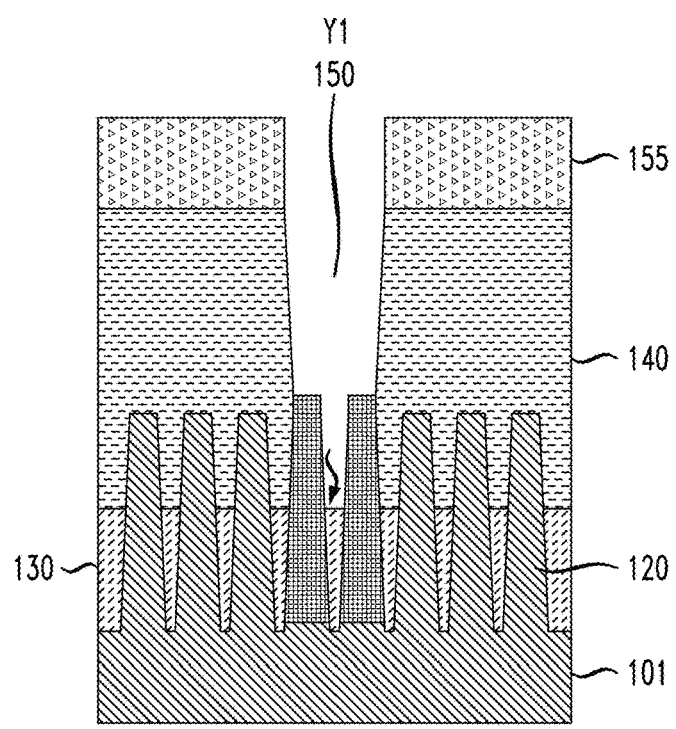
FIG. 9E is a cross-sectional view taken along the line Y1 in FIG. 9A and illustrating removal of a portion of a dummy gate in a method of manufacturing a semiconductor device, according to an exemplary embodiment of the present invention.

Referring to FIG. 9D, which is a cross-sectional view taken along the line X2 in FIG. 9A (along a length of a dummy gate element 125), a similar structure of dummy gates 140, gate spacers 142 and ILD layers 135 to that illustrated in FIG. 9B is shown. However, the dielectric dummy elements 125 (e.g., dummy fins) do not include epitaxial source/drain regions thereon. In addition, FIG. 9D, which is taken along the line X2 in FIG. 9A, further illustrates a gate cut portion 150, which is a vacant area where a portion of a dummy gate 140 has been removed (see also FIG. 9A). Referring to FIG. 9D, and FIG. 9E, which is a cross-sectional view taken along the line Y1 in FIG. 9A, a portion of dummy gate 140 is removed through an opening in a gate cut mask 155 to form the gate cut portion 150. The gate cut mask 155 is formed of, for example, an OPL material and includes an opening where a dummy gate 140 is to be cut into segments. As can be seen in FIGS. 9D and 9E, the dummy gate material is removed from the dielectric fill layer 130 and from on and around the dummy elements 125 exposed through the opening in the gate cut mask 150. The removal is performed using, for example, dry etch with fluorine-containing gas or plasma (fluorides (e.g., xenon difluoride (XeF$_2$)), or with an interhalogen (BrF$_3$ or ClF$_3$)), sulfur hexafluoride (SF$_6$), hydrogen chloride (HCl), or any combination thereof. Alternatively, the removal is performed using, for example, a wet etch process containing ammonium hydroxide (NH$_4$OH), tetramethylammonium hydroxide (TMAH), hydrazine, ethylene diamine pyrocatechol (EDP), and/or HF/Nitric/Acetic Acid (HNA). According to the embodiments, referring to the arrow in FIG. 9E, in the event that the dummy gate material (e.g., a-Si) is not completely removed, and there is some residual dummy gate material at a bottom of the gate cut opening 150, due to the dielectric dummy elements 125, there is no concern of shorting between opposing edges of gate segments in a final structure since any residual dummy gate material is between two dielectric elements 125 (e.g., dummy fins). In contrast, in a conventional structure where there are no dummy elements 125 and only semiconductor elements (e.g., semiconductor fins), shorting between gate segments when there is residual dummy gate material can be a concern. Although two dummy gate/gate structure segments are described herein, the embodiments are not necessarily limited thereto, and dummy gates/gate structures may be divided into more than two segments.

Figure 10A:
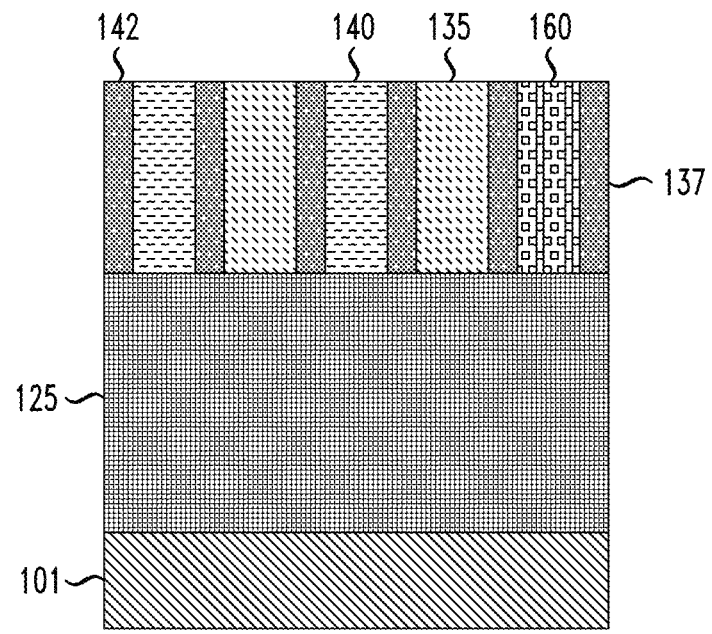
FIG. 10A is a cross-sectional view illustrating formation of a dielectric layer in a gate cut region in a method of manufacturing a semiconductor device, according to an exemplary embodiment of the present invention.
Figure 10B:
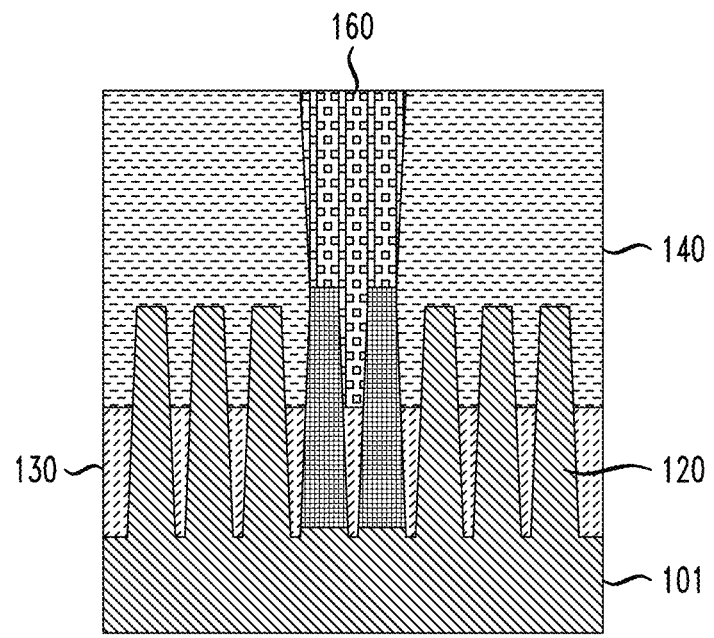
FIG. 10B is a cross-sectional view illustrating formation of a dielectric layer in a gate cut region in a method of manufacturing a semiconductor device, according to an exemplary embodiment of the present invention.

Referring to FIGS. 10A and 10B, a dielectric structure 160 is formed in the gate cut region 150 on the dielectric fill layer 130 and on and around the dummy elements 125 (e.g., dummy fins). The dielectric structure 160 is formed between segments of a dummy gate 140 and between adjacent spacers 142. According to an embodiment, the dielectric structure 160 includes a nitride liner layer (e.g., SiN) lining side and bottom portions of the region 150, and an oxide layer (e.g., silicon oxide) filling a remaining portion of the region 150. According to an embodiment, the dielectric structure 160 is formed using, for example, deposition techniques including, but not limited to, CVD, PECVD, PVD, ALD, MBD, PLD, and/or liquid LSMCD, followed by a planarization process, such as, for example, CMP, which planarizes the dielectric structure 160 with the dummy gates and spacers 140 and 142.

Figure 11A:
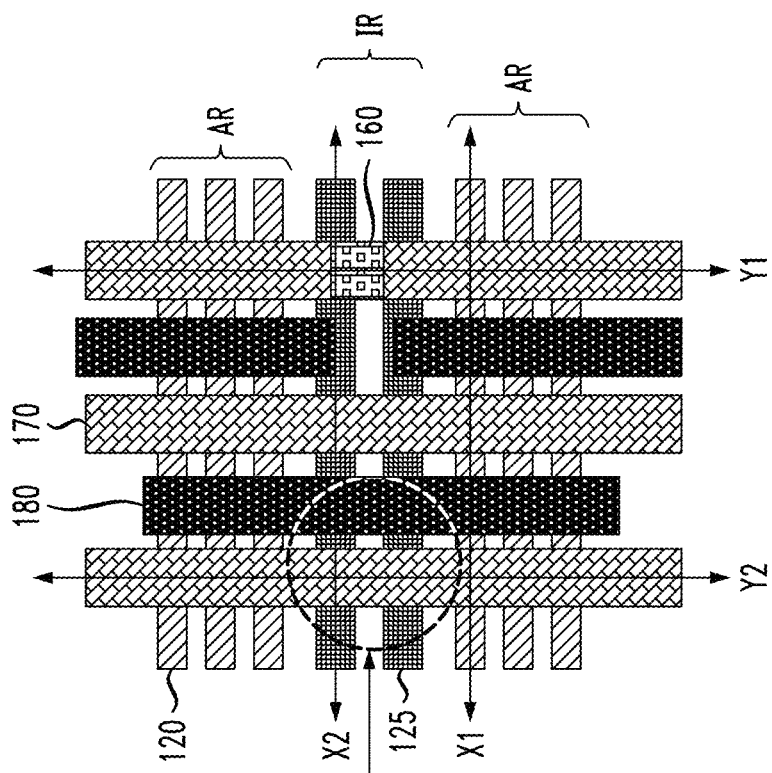
FIG. 11A is a top view illustrating replacement metal gate (RMG) processing and source/drain contact formation in a method of manufacturing a semiconductor device, according to an exemplary embodiment of the present invention.

The top view in FIG. 11A and the cross-sectional views in FIGS. 11B-11E illustrate RMG processing to replace the dummy gates 140 with gate structures 170 and formation of source/drain contacts 180 to source/drain regions 145. The cross-sectional views in FIGS. 11B-11E are taken along the lines X1, Y2, X2 and Y1, respectively in FIG. 11A.

The dummy gates 140 can be removed using a selective etch process that selectively removes the dummy gates 140 with respect to the ILD layers 135, the spacers 142 and the dielectric structure 160. The etch can be, for example, an isotropic etch, such as a wet chemical etch, or an anisotropic etch, such as RIE, ion beam etching, plasma etching or laser ablation. Gate structures 170 are formed in openings left after removal of the dummy gates 140, and are formed on and around the patterned substrate portions 120 and the dummy elements 125. In accordance with an embodiment, the gate structures 170 include a gate dielectric layer formed of, for example, any suitable dielectric material, including but not limited to, silicon oxide, silicon nitride, silicon oxynitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, ALD, CVD, etc. In some embodiments, the gate dielectric has a thickness ranging from about 1nm to about 5 nm, although less and greater thicknesses are also possible.

The gate structures 170 further include gate conductor layers formed on the dielectric layer. Gate conductor layers can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au)), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaC, TaMgC, carbon nanotube, conductive carbon, graphene, or any suitable combination of these materials. The conductive material may further comprise dopants that are incorporated during or after deposition. In some embodiments, the gate structures 170 may further comprise a workfunction setting layer between a gate dielectric and a gate conductor. The workfunction setting layer can be a workfunction metal (WFM). WFM can be any suitable material, including but not limited to, a nitride, including but not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to, titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, ALD, CVD, PVD, sputtering, plating, evaporation, ion beam deposition, electron beam deposition, laser assisted deposition, chemical solution deposition, etc. The gate structures 170 function as gate electrodes in an operational device.

As can be seen in FIGS. 11B-11E, self-aligned contact (SAC) cap layers 173 are formed on the gate structures 170 to fill in areas formerly occupied by the dummy gates 140, such as the areas adjacent the spacers 142. The SAC layers 173 include the same or similar dielectric material as the material of the spacers 142, and are deposited using, for example, one or more deposition techniques including, but not limited to, CVD, PECVD, RFCVD, PVD, ALD, MBD, PLD, and/or LSMCD, sputtering, followed by a planarization process, such as CMP. Alternatively, the SAC layer 173 can have different material from the spacer material.

Figure 11C:
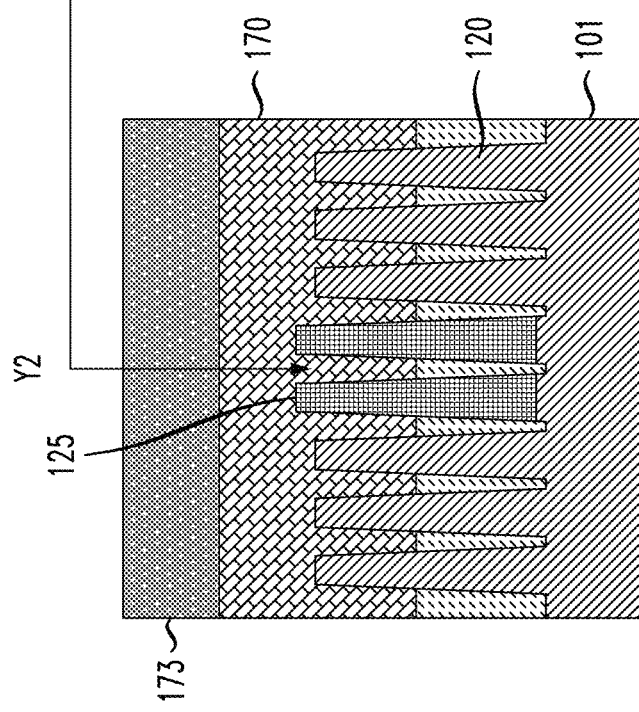
FIG. 11C is a cross-sectional view taken along the line Y2 in FIG. 11A and illustrating RMG processing and cap layer formation in a method of manufacturing a semiconductor device, according to an exemplary embodiment of the present invention.
Figure 11B:
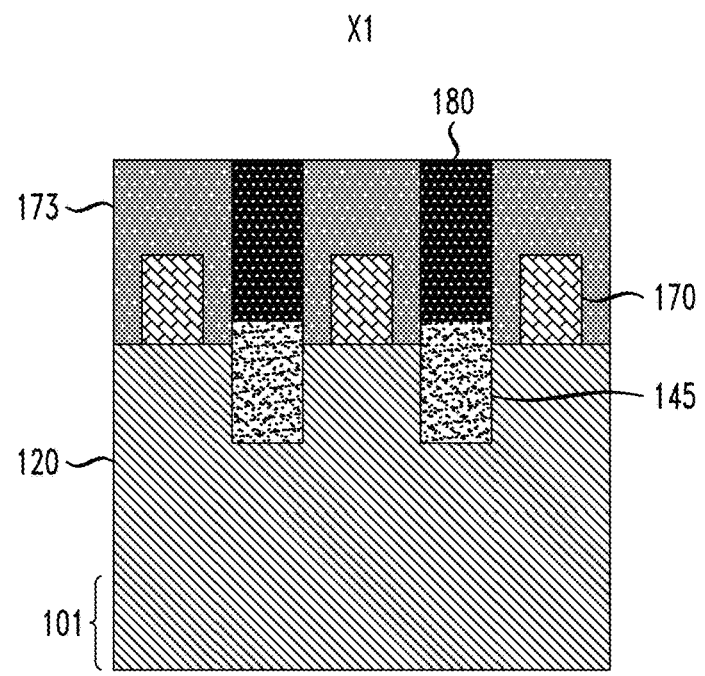
FIG. 11B is a cross-sectional view taken along the line X1 in FIG. 11A and illustrating RMG processing, and source/drain contact and cap layer formation in a method of manufacturing a semiconductor device, according to an exemplary embodiment of the present invention.
Figure 11D:
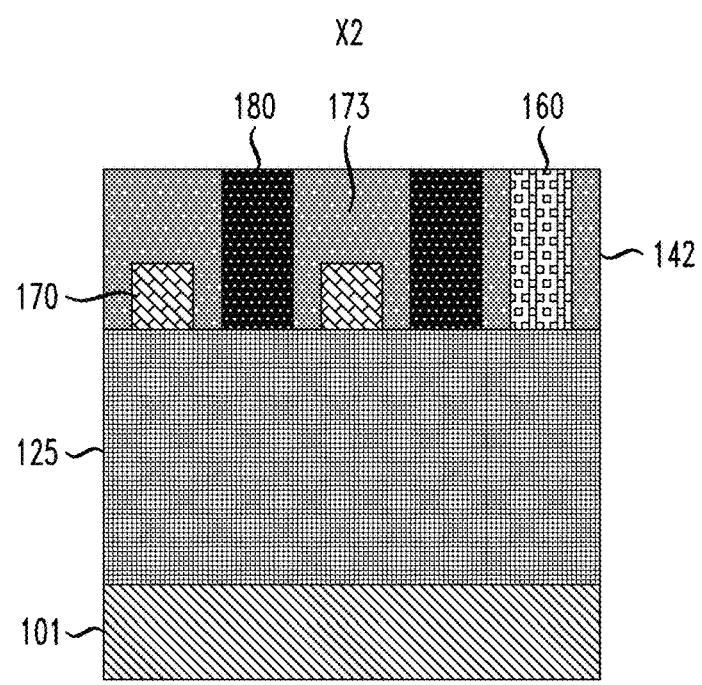
FIG. 11D is a cross-sectional view taken along the line X2 in FIG. 11A and illustrating RMG processing, and source/drain contact and cap layer formation in a method of manufacturing a semiconductor device, according to an exemplary embodiment of the present invention.

Referring to FIGS. 11A, 11B and 11D, portions of the ILD layers 135, including those portions over the source/drain regions 145 are removed and replaced with source/drain contacts 180. The removal of the portions of the ILD layers 135 is performed using, for example, lithography followed by RIE, to expose the source/drain regions 145. Contacts 180 to source/drain regions 145 are formed in trenches in the ILD layers 135 by filling the trenches with contact material layers including, for example, electrically conductive material such as, but not necessarily limited to, tungsten, cobalt, zirconium, tantalum, titanium, aluminum, ruthenium, and/or copper. A liner layer including, for example, titanium and/or titanium nitride, may be formed on side and bottom surfaces of the trenches and on the source/drain regions 145 before filling the trenches with the contact material layers.

Deposition of the contact material layers can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

As can be seen in FIG. 11A, the source/drain contacts 180 and gate structures 170 extend over semiconductor and dummy dielectric fins 120 and 125 in isolation and active regions IR and AR. The double-headed arrow between FIGS. 11A and 11C illustrates dummy dielectric fins 125 in an isolation region, which reduce parasitic capacitance relative to conventional structures between a shared source/drain contact 180 and a shared gate structure 170 for two active transistor regions AR (circled portion in FIG. 11A). Relative to conventional structures, the dummy dielectric fins 125 effectively replace lower portions of the gate structures 170 and the source/drain contacts 180 with dielectric material resulting in less overlapping area between the gate structures 170 and the source/drain contacts 180, thereby reducing parasitic capacitance.

Figure 11E:
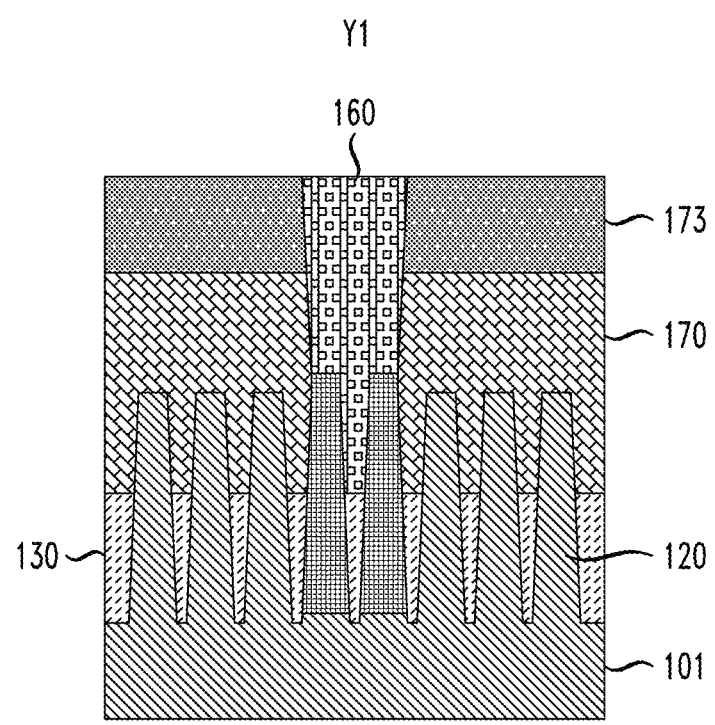
FIG. 11E is a cross-sectional view taken along the line Y1 in FIG. 11A and illustrating RMG processing and cap layer formation in a method of manufacturing a semiconductor device, according to an exemplary embodiment of the present invention.

FIGS. 11A and 11E show a segmented gate structure 170 with the dielectric structure 160 between the segments of the segmented gate structure 170. The segmented gate structure illustrates a non-shared scenario, where respective segments are electrically isolated gates for transistors of respective active regions AR. As noted herein above in connection with FIG. 9E, the dummy fins 125 prevent shorting between gate segments of the different active regions AR in the event there is residual dummy gate material under the dielectric structure 160. FIG. 11A further illustrates two source/drain contact regions 180 adjacent the respective gate segments for the respective active regions AR.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   patterning a plurality of semiconductor fins on a semiconductor substrate;
   replacing at least two of the plurality of semiconductor fins with a plurality of dummy fins comprising a dielectric material;
   forming a gate structure on and around the plurality of semiconductor fins and the plurality of dummy fins; and
   forming a source/drain contact adjacent the gate structure;
   wherein the patterning of the plurality of semiconductor fins comprises:
   forming a plurality of first hardmask portions on the semiconductor substrate, wherein the plurality of first hardmask portions comprise a first material;
   replacing at least two of the plurality of first hardmask portions with a plurality of second hardmask portions, wherein the plurality of second hardmask portions comprise a second material different from the first material; and
   transferring a pattern of the plurality of first and second hardmask portions to the semiconductor substrate to pattern the plurality of semiconductor fins.

2. The method according to claim 1, wherein the plurality of semiconductor fins are formed in at least one active region, and the plurality of dummy fins are formed in at least one isolation region.

3. The method according to claim 1, wherein the plurality of dummy fins are formed between two semiconductor fins of the plurality of semiconductor fins.

4. The method according to claim 1, wherein the replacing of the at least two of the plurality of semiconductor fins with the plurality of dummy fins comprises:
   forming a dielectric fill layer on the semiconductor substrate and between the plurality of semiconductor fins;
   selectively removing the plurality of second hardmask portions to expose underlying semiconductor fins of the plurality of semiconductor fins;
   removing the exposed underlying semiconductor fins to create a plurality of openings in the dielectric fill layer; and
   depositing a dielectric material in the plurality of openings in place of the removed semiconductor fins to form the plurality of dummy fins.

5. The method according to claim 1, wherein the second material has an etch selectivity with respect to the first material.

6. The method according to claim 1, wherein forming the gate structure comprises:
   forming a dummy gate on and around the plurality of semiconductor fins and the plurality of dummy fins; and
   removing the dummy gate and replacing the dummy gate with the gate structure, wherein the gate structure comprises at least one conductive material.

7. The method according to claim 1, wherein the source/drain contact extends over the plurality of semiconductor fins and the plurality of dummy fins.

8. The method according to claim 1, wherein the gate structure and source/drain contact are shared between two active transistor regions.

9. A method for manufacturing a semiconductor device, comprising:
   patterning a plurality of semiconductor fins on a semiconductor substrate;
   replacing at least two of the plurality of semiconductor fins with a plurality of dummy fins comprising a dielectric material;
   forming a gate structure on and around the plurality of semiconductor fins and the plurality of dummy fins;
   forming a source/drain contact adjacent the gate structure;
   forming a dummy gate on and around the plurality of semiconductor fins and the plurality of dummy fins;
   removing the dummy gate and replacing the dummy gate with the gate structure, wherein the gate structure comprises at least one conductive material; and
   removing a portion of the dummy gate between the plurality of dummy fins to create an opening between two dummy gate segments.

10. The method according to claim 9, further comprising depositing a dielectric material in the opening between the two dummy gate segments.

11. The method according to claim 9, wherein the removing and the replacing of the dummy gate with the gate structure comprises removing the two dummy gate segments and replacing of the two dummy gate segments with two gate structure segments.

12. The method according to claim 9, wherein the plurality of semiconductor fins are formed in at least one active region, and the plurality of dummy fins are formed in at least one isolation region.

13. The method according to claim 9, wherein the plurality of dummy fins are formed between two semiconductor fins of the plurality of semiconductor fins.

14. The method according to claim 9, wherein the patterning of the plurality of semiconductor fins comprises:
   forming a plurality of first hardmask portions on the semiconductor substrate, wherein the plurality of first hardmask portions comprise a first material;
   replacing at least two of the plurality of first hardmask portions with a plurality of second hardmask portions, wherein the plurality of second hardmask portions comprise a second material different from the first material; and
   transferring a pattern of the plurality of first and second hardmask portions to the semiconductor substrate to pattern the plurality of semiconductor fins.

15. The method according to claim 14, wherein the replacing of the at least two of the plurality of semiconductor fins with the plurality of dummy fins comprises:
   forming a dielectric fill layer on the semiconductor substrate and between the plurality of semiconductor fins;
   selectively removing the plurality of second hardmask portions to expose underlying semiconductor fins of the plurality of semiconductor fins;
   removing the exposed underlying semiconductor fins to create a plurality of openings in the dielectric fill layer; and
   depositing a dielectric material in the plurality of openings in place of the removed semiconductor fins to form the plurality of dummy fins.

16. The method according to claim 14, wherein the second material has an etch selectivity with respect to the first material.

17. A method for manufacturing a semiconductor device, comprising:
   forming a plurality of first hardmask portions on a semiconductor substrate, wherein the plurality of first hardmask portions comprise a first material;
   forming a plurality of second hardmask portions on the semiconductor substrate, wherein the plurality of second hardmask portions comprise a second material different from the first material;
   transferring a pattern of the plurality of first and second hardmask portions to the semiconductor substrate to form a plurality of patterned substrate portions;
   forming a dielectric fill layer on the semiconductor substrate and between the plurality of patterned substrate portions;
   selectively removing the plurality of second hardmask portions to expose underlying patterned substrate portions of the plurality of patterned substrate portions;
   removing the exposed underlying patterned substrate portions to create a plurality of openings in the dielectric fill layer; and
   depositing a dielectric material in the plurality of openings in place of the removed patterned substrate portions to form a plurality of dummy elements.

18. The method according to claim 17, further comprising:
   removing the plurality of first hardmask portions;
   recessing the dielectric fill layer; and
   forming a gate structure on the recessed dielectric fill layer and on and around the plurality of patterned substrate portions and the plurality of dummy elements.

19. The method according to claim 18, wherein forming the gate structure comprises:
   forming a dummy gate on and around the plurality of patterned substrate portions and the plurality of dummy elements; and
   removing the dummy gate and replacing the dummy gate with the gate structure, wherein the gate structure comprises at least one conductive material.

20. The method according to claim 17, wherein the second material has an etch selectivity with respect to the first material.

* * * * *